(12) United States Patent
Yamazaki et al.

(10) Patent No.: US 6,400,426 B1
(45) Date of Patent: Jun. 4, 2002

(54) REFLECTIVE LIQUID CRYSTAL DISPLAY PANEL AND DEVICE USING SAME

(75) Inventors: Shunpei Yamazaki, Tokyo; Hisashi Ohtani, Kanagawa; Jun Koyama, Kanagawa; Satoshi Teramoto, Kanagawa, all of (JP)

(73) Assignee: Semiconductor Energy Laboratory Co., Ltd., Osaka (JP)

( * ) Notice: Subject to any disclaimer, the term of this patent is extended or adjusted under 35 U.S.C. 154(b) by 0 days.

(21) Appl. No.: 09/058,870

(22) Filed: Apr. 13, 1998

(30) Foreign Application Priority Data

Apr. 15, 1997 (JP) .............................. 9-113549

(51) Int. Cl.[7] ..................... G02F 1/1333; G02F 1/1343; G02F 1/136
(52) U.S. Cl. .......................... 349/43; 349/138; 349/139
(58) Field of Search ......................... 345/42, 43, 151, 345/39, 139; 349/42, 43, 39, 139, 151, 138

(56) References Cited

U.S. PATENT DOCUMENTS

| 4,103,297 A | 7/1978 | McGreivy et al. ............. 345/90 |
| 5,003,356 A | 3/1991 | Wakai et al. ................ 257/390 |
| 5,032,883 A | 7/1991 | Wakai et al. ................. 257/59 |
| 5,056,895 A | 10/1991 | Kahn ........................ 349/114 |
| 5,084,905 A | 1/1992 | Sasaki et al. ............... 257/716 |
| 5,200,846 A | 4/1993 | Hiroki et al. ................ 399/179 |
| 5,200,847 A | * 4/1993 | Mawatari et al. ............ 349/151 |
| 5,235,195 A | 8/1993 | Tran et al. ..................... 257/59 |
| 5,250,931 A | * 10/1993 | Misawa et al. .............. 349/151 |
| 5,264,077 A | 11/1993 | Fukui et al. .................... 216/51 |
| 5,287,205 A | 2/1994 | Yamazaki et al. ........... 349/174 |
| 5,308,998 A | 5/1994 | Yamazaki et al. ............. 257/57 |
| 5,327,001 A | 7/1994 | Wakai et al. ................. 257/352 |
| 5,341,012 A | * 8/1994 | Misawa et al. .............. 349/151 |
| 5,414,442 A | 5/1995 | Yamazaki et al. ............. 345/89 |
| 5,453,858 A | * 9/1995 | Yamazaki et al. ........... 349/151 |
| 5,495,353 A | 2/1996 | Yamazaki et al. ............. 349/43 |
| 5,568,288 A | 10/1996 | Yamazaki et al. ............. 349/42 |
| 5,583,369 A | 12/1996 | Yamazaki et al. ........... 257/365 |
| 5,585,949 A | 12/1996 | Yamazaki et al. ............. 349/41 |
| 5,612,799 A | 3/1997 | Yamazaki et al. ............. 349/42 |
| 5,614,732 A | 3/1997 | Yamazaki ..................... 257/66 |
| 5,686,328 A | 11/1997 | Zhang et al. .................. 438/30 |
| 5,717,224 A | 2/1998 | Zhang .......................... 257/59 |
| 5,763,899 A | 6/1998 | Yamazaki et al. ............. 257/59 |
| 5,784,073 A | 7/1998 | Yamazaki et al. ........... 395/511 |
| 5,812,231 A | * 9/1998 | Kochi et al. ................... 349/43 |
| 5,821,138 A | 10/1998 | Yamazaki et al. ........... 438/166 |
| 5,838,508 A | 11/1998 | Sugawara ................... 359/890 |
| 5,847,410 A | 12/1998 | Nakajima ..................... 257/59 |
| 5,879,974 A | 3/1999 | Yamazaki ................... 438/162 |
| 5,899,547 A | 5/1999 | Yamazaki et al. ............. 349/43 |
| 5,905,555 A | 5/1999 | Yamazaki et al. ........... 349/138 |
| 5,925,421 A | 7/1999 | Yamazaki et al. ........... 427/534 |
| 5,933,205 A | 8/1999 | Yamazaki et al. ............. 349/43 |
| 5,946,059 A | 8/1999 | Yamazaki et al. ............. 349/43 |
| 5,946,561 A | 8/1999 | Yamazaki et al. ........... 438/166 |
| 5,952,708 A | 9/1999 | Yamazaki ..................... 257/59 |
| 5,956,105 A | 9/1999 | Yamazaki et al. ............. 349/43 |
| 5,963,278 A | 10/1999 | Yamazaki et al. ............. 349/43 |
| 5,977,562 A | 11/1999 | Hirakata et al. ............... 257/59 |
| 5,990,491 A | 11/1999 | Zhang ......................... 349/143 |
| 5,990,542 A | 11/1999 | Yamazaki ................... 257/642 |
| 6,005,648 A | 12/1999 | Zhang et al. .................. 349/43 |
| 6,011,277 A | 1/2000 | Yamazaki ..................... 257/66 |
| 6,011,607 A | * 1/2000 | Yamazaki et al. ........... 349/151 |
| 6,015,724 A | 1/2000 | Yamazaki ................... 438/151 |
| 6,027,960 A | 2/2000 | Kusumoto et al. .......... 438/166 |

* cited by examiner

*Primary Examiner*—Toan Ton
(74) *Attorney, Agent, or Firm*—Eric J. Robinson; Nixon Peabody LLP

(57) ABSTRACT

There is disclosed an active matrix reflective liquid crystal display panel on which an active matrix circuit is integrated with peripheral driver circuits. Metal lines in the peripheral driver circuits are formed simultaneously with pixel electrodes. Thus, neither the process sequence nor the structure is complicated.

21 Claims, 7 Drawing Sheets

REFLECTIVE LIQUID CRYSTAL DISPLAY PANEL AND DEVICE USING SAME

FIELD OF THE INVENTION

The present invention relates to a reflective liquid crystal display structure in which peripheral driver circuits are integrated with other circuitry.

DESCRIPTION OF THE PRIOR ART

A structure comprising a substrate on which an active matrix circuit and peripheral driver circuits for driving the active matrix circuit are all packed is known. At least one TFT is disposed at each pixel of the active matrix circuit. This structure is known as the active matrix display integrated with peripheral driver circuits.

Generally, a peripheral driver circuit is composed of circuits (typified by shift registers) and buffer circuits for supplying signals to the active matrix circuit. However, it is considered that the trend is toward constructing circuits handling image information and various timing signals from TFTs and toward integrating these TFTs as peripheral driver circuits with the active matrix circuit on the same substrate. In the past, such circuits have been composed of externally attached ICs.

Essentially, the active matrix circuit comprises source lines and gate lines arranged in rows and columns. TFTs are disposed near the intersections. On the other hand, the peripheral driver circuit is based on a CMOS circuit. However, it is expected that the circuit will become more complex in configuration. In this structure, the use of multilevel wiring is required to reduce the area occupied. However, if an additional layer is formed to achieve the multilevel wiring, the fabrication process is complicated.

SUMMARY OF THE INVENTION

It is an object of the present invention to provide a reflective liquid crystal display panel on which an active matrix circuit is integrated with peripheral driver circuits having multilevel wiring that can be accomplished with greater ease than conventional.

The invention disclosed herein is directed to a reflective liquid crystal display. This kind of liquid crystal display uses metal electrodes as reflective electrodes. For example, the metal electrodes consist chiefly of aluminum.

The present invention has been made by taking notice of the material of the reflective electrodes. Conducting lines arranged in the peripheral driver circuits are formed out of the same material as the pixel electrodes simultaneously with the formation of-the pixel electrodes.

In this way, multilevel wiring necessary for the peripheral driver circuits can be constructed without any additional process step, though the pattern is made more complex.

Since the reflective electrodes can be made of a low-resistivity material such as aluminum, they are preferably used to form conducting lines in the peripheral driver circuits.

In the transmissive liquid crystal display, pixel electrodes are made of a material having a relatively high resistivity such as ITO. Therefore, the present invention is not adapted to be used in the transmissive liquid crystal display.

The peripheral, driver circuits referred to herein include shift register circuits and buffer circuits that directly drive the active matrix circuits. Furthermore, circuits for producing various timing signals, circuits for handling image information, various memory devices, and arithmetic units are included.

The present invention provides a reflective liquid crystal display panel comprising an active matrix circuit formed on a substrate, peripheral driver circuits including circuits for driving the active matrix circuit, and reflective pixel electrodes arranged in rows and columns in the active matrix circuit. The active matrix circuit and the peripheral driver circuits are formed on the same substrate. The active matrix circuit is composed of TFTs. The peripheral driver circuits are also composed of TFTs. The peripheral driver circuits have conducting lines made of the same material as the reflective pixel electrodes.

In the active matrix circuit of the liquid crystal display of the structure described above, source lines and the gate lines are arranged in rows and columns. TFTs are disposed near the intersections of these source and gate lines. The drains of the TFTs are disposed at the pixel electrodes.

Peripheral circuits include circuits composed of shift register circuits, analog switches, buffers, and so on. This kind of circuit is ordinarily referred to as a peripheral driver circuit. Further peripheral circuits include oscillator circuits, circuits handling image information, and circuits equipped with memory devices or the like.

It is considered that future trend will be toward adding various other functions to the above-described peripheral circuits. Accordingly, the peripheral circuits referred to herein embrace circuitry having various functions (known as a system-on-panel), as well as circuits for driving an active matrix circuit.

TFTs can take various forms such as top-gate type, bottom-gate type, and multigate type in which numerous TFTs are equivalently connected in series.

Preferably, the material of the reflective electrodes has a high reflectivity and a low resistivity, as typified by silver, aluminum, and silver-aluminum alloys.

For example, in the case of the VGA standard (640×480 pixels), the frame of image is rewritten or refreshed at a rate of 60 times per second. This requires that the horizontal scanning driver circuit (peripheral driver circuit on the side of source lines) operate at a rate of 640×480×60=18.5 MHz. In the case of the XGA standard (1024×768 pixels), an operating speed. of 1024×768×60=47 MHz is necessitated.

In these cases, the resistivity of the conducting lines in the peripheral driver circuits should be made as low as possible. The present invention is quite useful for this purpose.

A specific example in which the conducting lines in peripheral circuits are made of the same material as the reflective pixel electrodes is shown in FIG. 6. When the pixel electrodes, 141, are formed, the conducting lines, 142, in the peripheral circuits are formed from the same material as the pixel electrodes.

This is achieved by forming the pattern of the pixel electrodes 141 and the pattern of the conducting lines 142 simultaneously out of conducting film (not shown) that forms the pixel electrodes. This can be checked by taking an electron microscope image of a cross section of the structure, determining whether the pixel electrodes and the conducting lines are present in the common layer, determining whether they are equal in film thickness, and measuring the doping level to know whether the material is uniform or not.

Other objects and features of the invention will appear in the course of the description thereof, which follows.

DETAILED DESCRIPTION OF THE INVENTION

Figure 6:
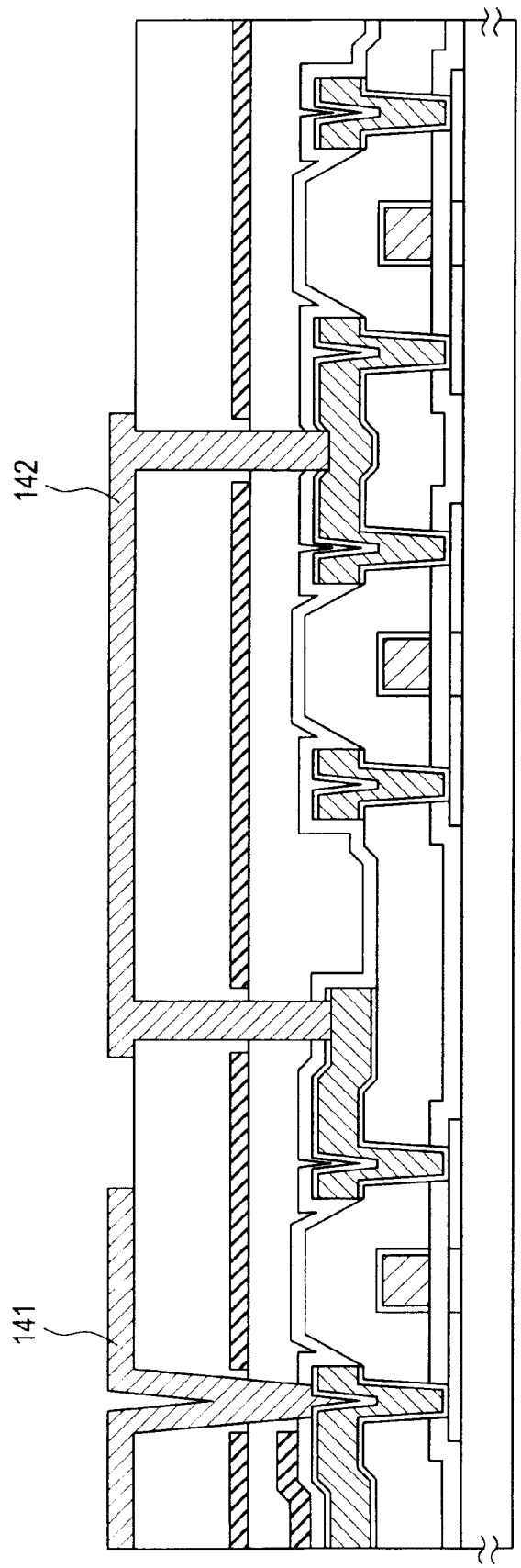

Referring to FIG. 6, there is shown a reflective liquid crystal display (LCD) panel in accordance with the present invention. This LCD panel has a pixel matrix and peripheral circuits. Reflective electrodes 141 are disposed in the pixel matrix. Conducting lines 142 are formed in the peripheral circuits. The reflective electrodes 141 and the conducting lines 142 are formed simultaneously. This permits the conducting lines of the peripheral circuits to be formed by a common process step. Consequently, the manufacturing process sequence and the structure can be made simpler.

Since the reflective electrodes can be made of a material having a low resistivity, the conducting lines of the peripheral driver circuits that are formed simultaneously with the reflective electrodes can be fabricated as low-resistivity lines.

A reflective active matrix liquid crystal display (AMLCD) is fabricated by a method according to a first embodiment of the present invention. The process sequence for effecting this method is illustrated in FIGS. 1–7. N-channel TFTs disposed in a pixel matrix circuit and CMOS circuits forming peripheral driver circuits are fabricated at the same time.

First, a substrate 101 of glass or quartz is prepared. If the flatness of the substrate is poor, it is preferable to form a film of silicon oxide or silicon oxynitride on the surface of the substrate.

Generally, a substrate having an insulating surface can be used as the aforementioned substrate. A substrate having an insulating surface can be a glass substrate, a quartz substrate, a substrate of glass or quartz on which an insulating film of silicon oxide or other material is deposited, and a semiconductor substrate such as a silicon wafer on which an oxide film is deposited.

Then, an amorphous silicon film (not shown) is formed on the surface of the substrate to a thickness of 50 nm by low-pressure thermal CVD.

The amorphous silicon film is heat-treated to crystallize the amorphous silicon film. In this way, a crystalline silicon film is obtained. The crystallization may also be effected by irradiation of laser light or other intense light.

Subsequently, the crystalline silicon film is patterned to form islands of pattern 102, 103, and 104, which will become active layers of TFTs. The island 102 will become the active layer of an N-channel TFT (NTFT) disposed in a pixel matrix circuit. The island 103 will become the active layer of a P-channel TFT (PTFT) forming a CMOS circuit forming a peripheral driver circuit. The island 104 will become the active layer of an N-channel TFT (NTFT) forming a CMOS circuit forming a peripheral driver circuit.

Figure 1:
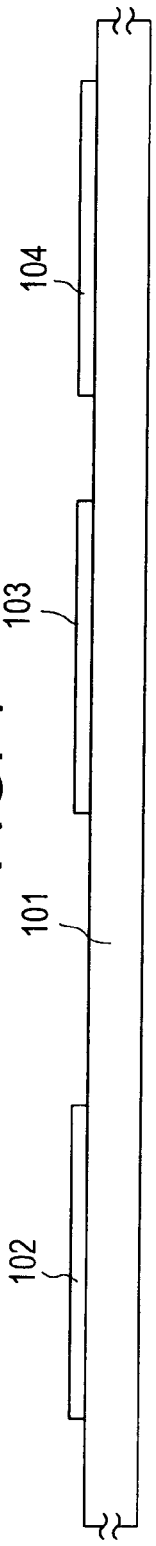
FIGS. 1–8 are cross-sectional views illustrating a process sequence for fabricating an LCD (liquid crystal display) panel in accordance with the present invention.
Figure 2:
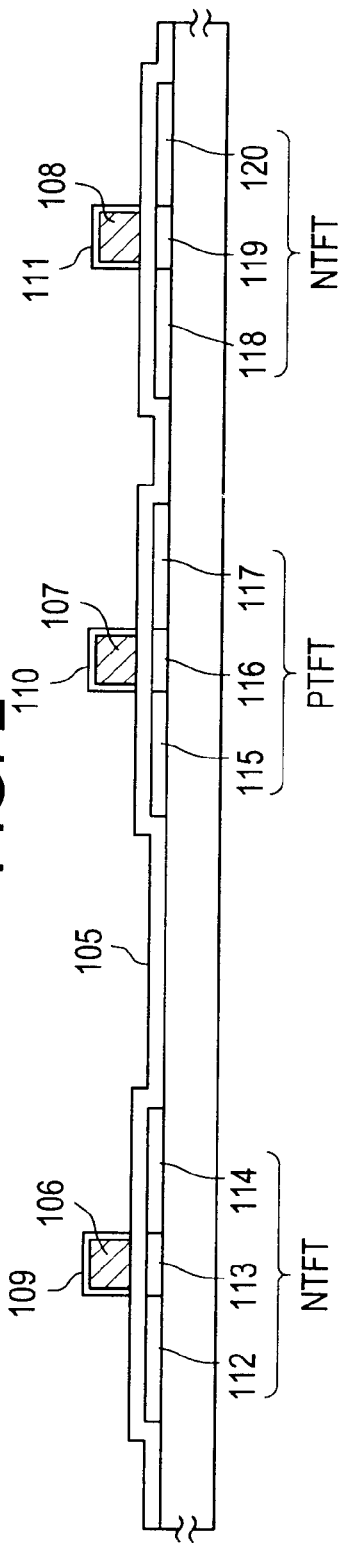

The resulting state is shown in FIG. 1. Then, a silicon oxide film 105 is formed as a gate insulator film to a thickness of 100 nm by PECVD as shown in FIG. 2.

Thereafter, an aluminum film is formed to a thickness of 400 nm by sputtering. This aluminum film is patterned into stripes 106, 107, and 108 which will become the gate electrodes of the TFTs and gate interconnects extending from the gate electrodes.

An anodic oxide film, 109, 110, and 111, is formed on the aluminum pattern, 106, 107, and 108, to a thickness of 60 nm. The anodic oxide film electrically insulates and physically protects the aluminum pattern.

A resist mask (not shown) is deposited on top of the PTFT to cover it. Phosphorus (P) ions are implanted by plasma doping. As a result, the source region 112, the channel region 113, and the drain region 114 of the NTFT arranged in the pixel matrix are formed in a self-aligned manner. Also, the source region 120, the channel region 119, and the drain region 118 of the NTFT forming the CMOS circuit of the peripheral driver circuit are formed in a self-aligned manner.

Then, the resist mask deposited on top of the PTFT is removed. A resist mask is placed on top of the NTFT. Under this condition, boron (B) ions are lodged by plasma doping. As a result of this process step, the source region 115, the channel region 116, and the drain region 117 of the PTFT forming the CMOS circuit of the peripheral driver circuit are formed in a self-aligned manner.

Subsequently, the resist mask (not shown) is removed. Laser light is directed at the laminate to improve the crystallinity of the doped regions and to activate the dopant element. In this manner, a state as shown in FIG. 2 is obtained.

Figure 3:
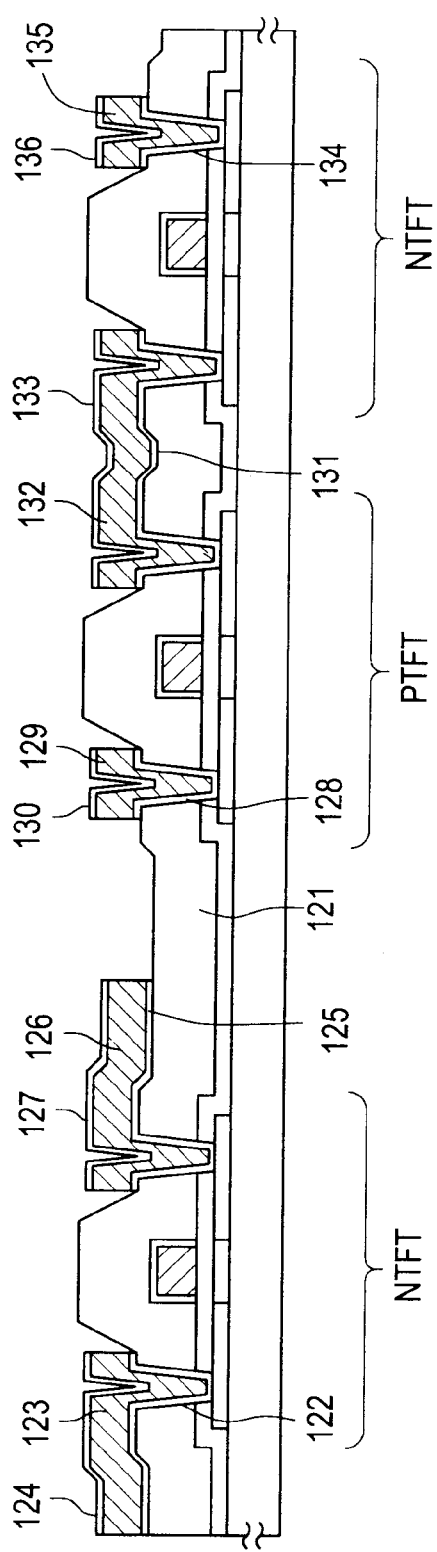
Figure 4:
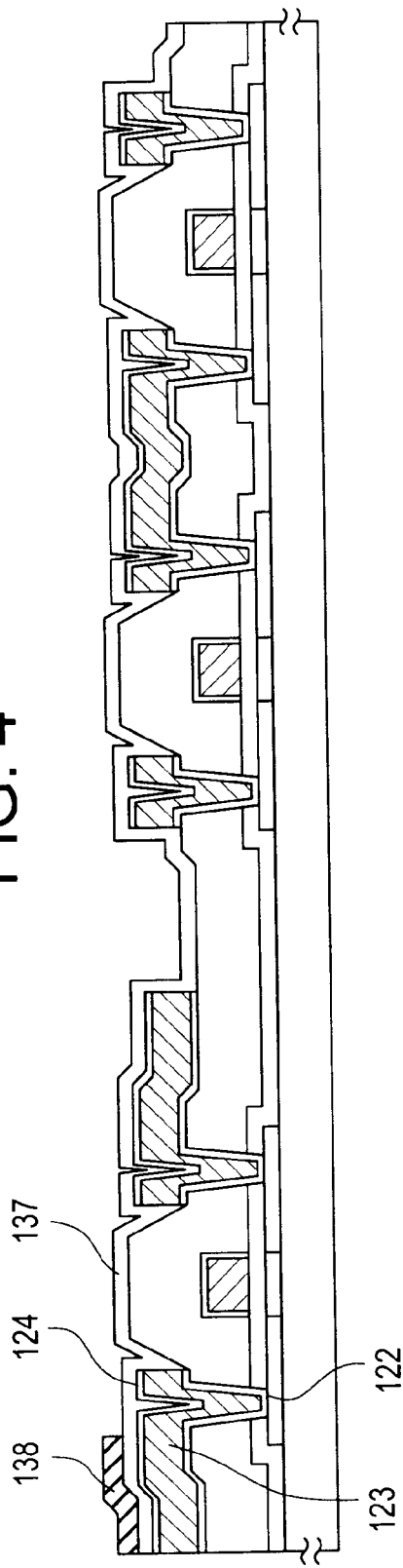

Then, as shown in FIG. 3, a silicon oxide film 121 is formed as an interlayer dielectric film to a thickness of 500 nm by PECVD. Contact holes are then formed, and a Ti-Al-Ti laminate film is sputter-deposited. Each Ti layer of this laminate film is 100 nm, while the Al layer is 400 nm. The Ti layers act to improve the electrical contact with semiconductor or with electrodes.

The Ti-Al-Ti laminate film is patterned to obtain a state as shown in FIG. 3, which portrays a pattern of the laminate film consisting of the titanium layer 122, the aluminum layer 123, and the titanium layer 124 forming the source electrode of the NTFT disposed in the pixel matrix. FIG. 3 also illustrates a pattern of the laminate film consisting of the titanium layer 125, the aluminum layer 126, and the titanium layer 127 forming the drain electrode of the NTFT arranged in the pixel matrix. Furthermore, FIG. 3 depicts a pattern of the laminate film consisting of the titanium layer 128, the aluminum layer 129, and the titanium layer 130. In addition, FIG. 3 represents a pattern of the laminate film consisting of the titanium layer 131, the aluminum layer 132, and the titanium layer 133 forming the drain electrode of the PTFT of the CMOS circuit. Further, a pattern of the laminate film consisting of the titanium layer 134, the aluminum layer 135, and the titanium layer 136 forming the drain electrode of the NTFT of the CMOS circuit is shown. Additionally, a pattern of the laminate film consisting of the titanium layer 131, the aluminum layer 132, and the titanium layer 133 constituting the drain electrode of the NTFT of the CMOS circuit is shown. In this way, a state as shown in FIG. 3 is derived.

Then, a silicon nitride film 137 is deposited to a thickness of 50 nm by PECVD. This silicon nitride film 137 forms the dielectric film of an auxiliary capacitor.

Thereafter, a titanium film (not shown) is sputter-deposited to a thickness of 150 nm. This film is patterned to form an electrode pattern 138 for the auxiliary capacitor. The auxiliary capacitor consists of the electrode, the titanium electrode 138, and the silicon nitride film 137 sandwiched between the titanium electrode 138 and the electrode consisting of the titanium layer 122, the aluminum layer 123, and the titanium layer 124. The silicon nitride film has a large dielectric constant and can be thinned and so a large capacitance can be accomplished.

If the liquid crystal panel is used for projection and its diagonal dimension is as small as less than 2 inches, the area of each pixel is small. Therefore, it is generally difficult to have sufficient auxiliary capacitance.

Figure 5:
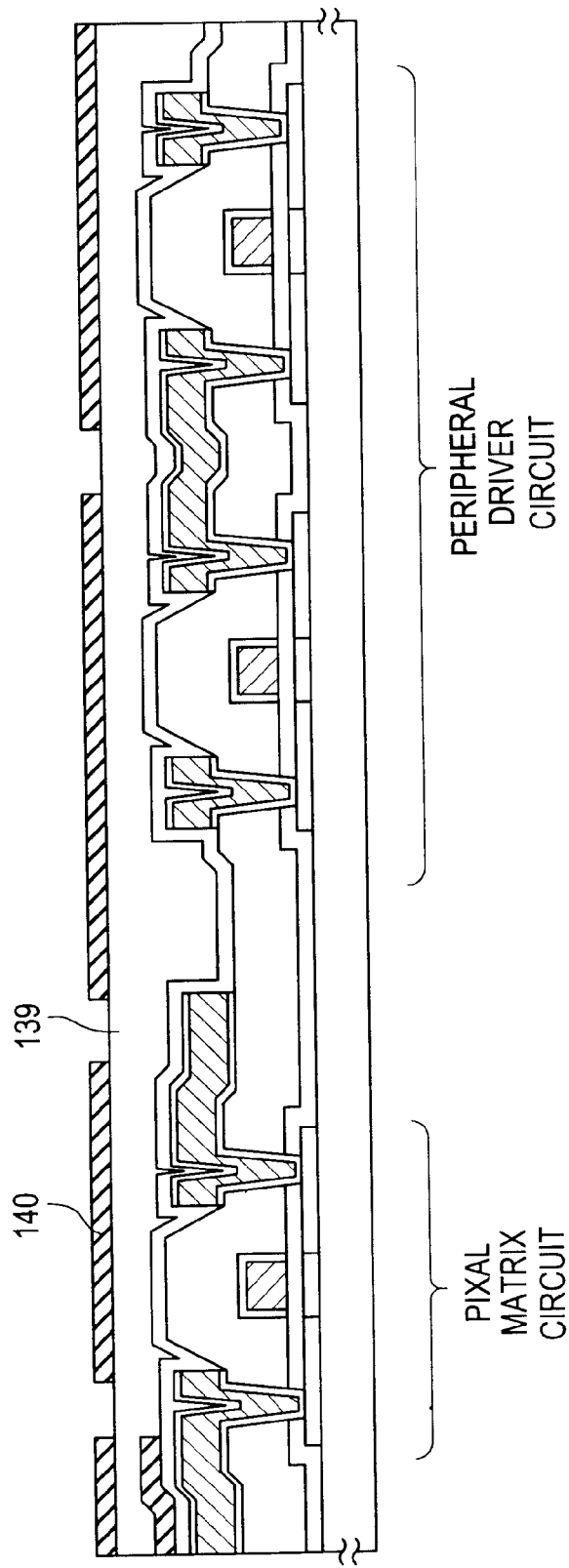

This difficulty can be solved by forming the capacitance of the structure according to the present embodiment. After obtaining the state shown in FIG. 4, a polyimide resinous film 139 is formed as an interlayer dielectric film as shown in FIG. 5. The thickness of the polyimide resinous film 139 is so set that its maximum film thickness is 1 $\mu$m. Other usable resins include polyamide, polyimidamide, epoxies, and acrylics.

A titanium film having a thickness of 150 nm is formed by sputtering and patterned to form a pattern 140 shown in FIG. 5. This pattern acts as a shield pattern for preventing electrical interference between its upper layer (i.e., the pixel electrodes and conducting lines) and its lower layer (i.e., TFTs and conducting lines). Also, the portion of the shield pattern 140 that overlies the driver circuit region shields the peripheral driver circuit against light. In this way, the state shown in FIG. 5 is obtained.

Then, contact holes are created. An aluminum film becoming pixel electrodes is sputter-deposited to a thickness of 350 nm. Subsequently, this aluminum film is patterned to simultaneously form pixel electrodes 141 and conducting lines 142 connecting the peripheral driver circuit and pixel matrix TFTs (FIG. 6).

The conducting lines 142 are formed by making use of the aluminum film that constitutes the pixel electrodes 141. Hence, it is not necessary to perform any independent process step. That is, any additional process step is not necessary to form the conducting lines 142. Instead of the aluminum film, the pixel electrodes 141 may be formed from silver or a silver-aluminum alloy.

Figure 7:
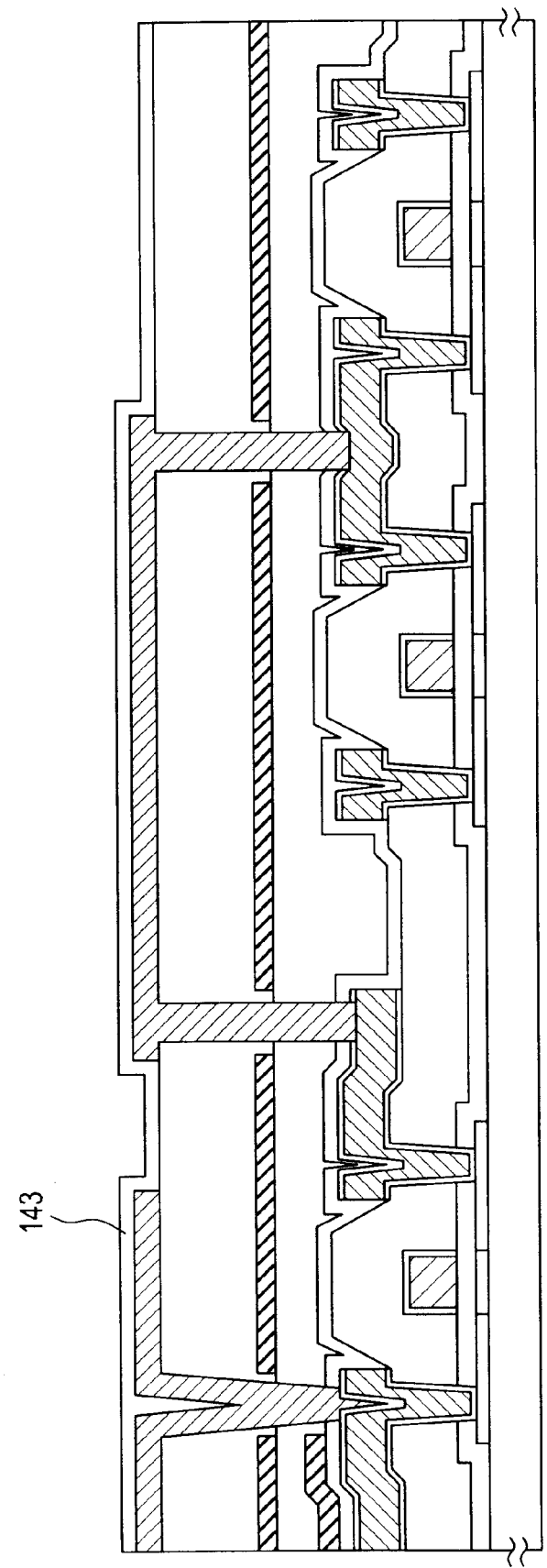

After obtaining the state of FIG. 6, an orientation film 143 acting as an orientation film and consisting of polyimide resin is deposited to a thickness of 150 nm, as shown in FIG. 7. Thus, one substrate on which circuitry consisting of TFTs and undergone orientation processing is completed.

After achieving the state of FIG. 7, another substrate made of glass or quartz is prepared and bonded to the substrate (referred to as the TFT substrate) shown in FIG. 7. A liquid crystal material is injected between these two substrates. Thus, a reflective AMLCD panel shown in FIG. 8 is obtained.

Figure 8:
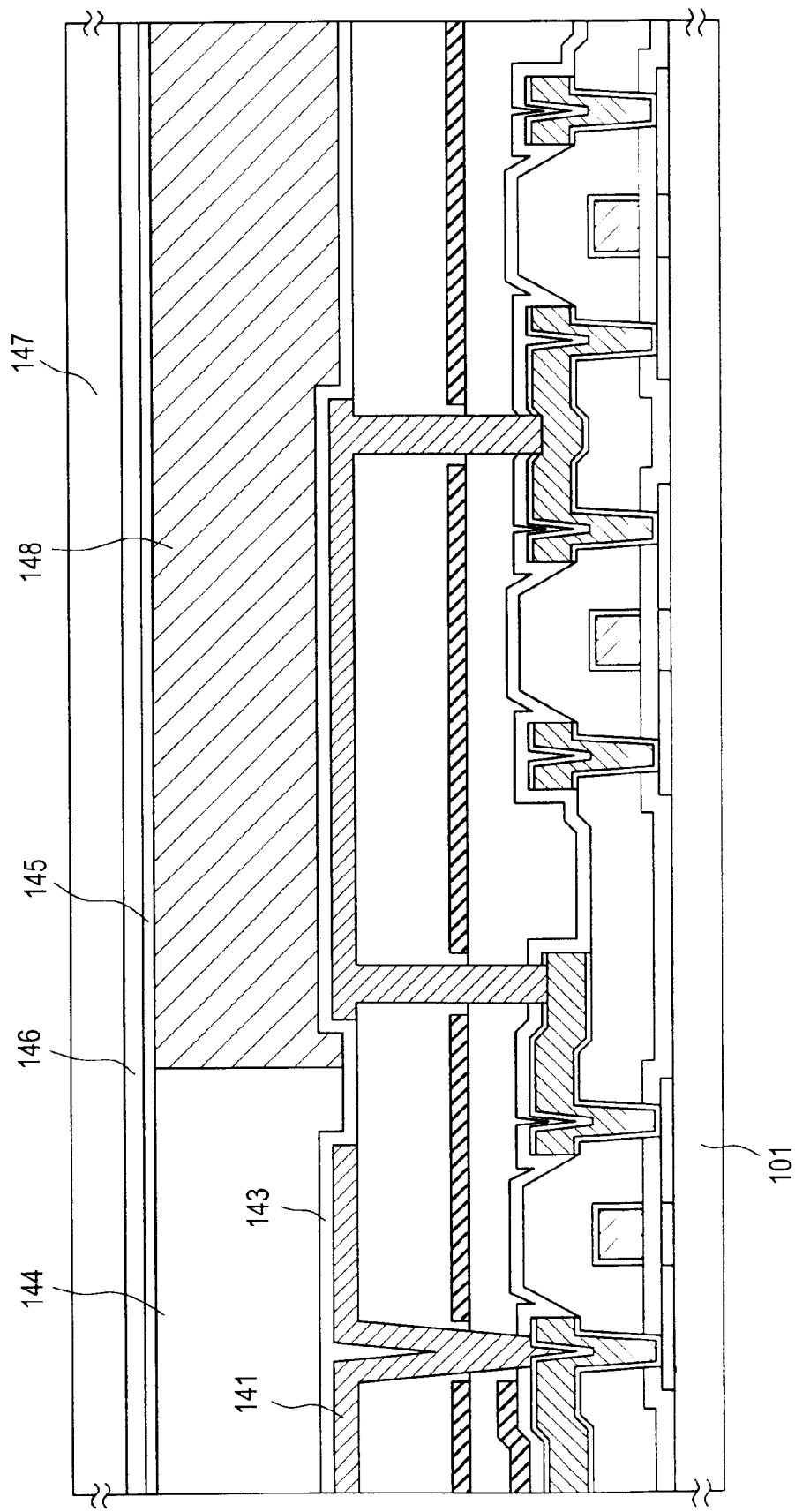

In FIG. 8, the counter substrate, or the substrate opposite to the TFT substrate, is indicated by 147. A counter electrode 146 is made of ITO and located opposite to the pixel electrodes 141 formed on the TFT substrate.

A seal material 148 bonds together the substrates 147 and 101 and prevents the liquid crystal material from leaking out. The liquid crystal material is indicated by 144. Where the LCD panel is of the reflective type, the display is operated in the birefringence mode. In particular, the plane of polarization of light propagates through the liquid crystal material layer perpendicularly to the substrate plane, the liquid crystal material consisting of molecules oriented parallel to the substrates. The plane of polarization changes from vertically polarized, elliptically polarized, circularly polarized, elliptically polarized, and horizontally polarized state in turn.

A second embodiment of the present invention gives examples of a device or appliance equipped with an LCD panel in accordance with the present invention. That is, these examples are video camera, digital still camera, head mount display, car navigational system, personal computer, and portable intelligent terminals (such as mobile computers and portable telephones).

Figure 9A:
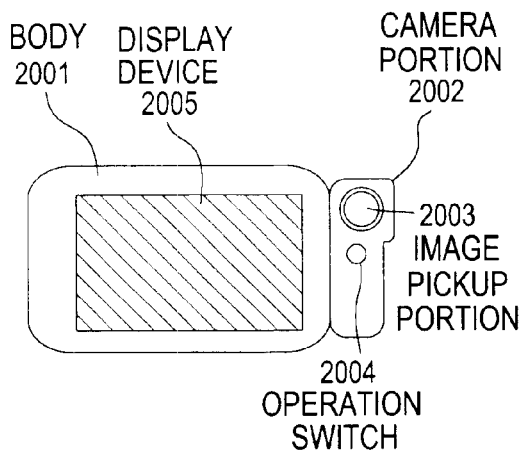
FIGS. 9(A)–9(F) are a diagram showing devices equipped with a liquid crystal panel in accordance with the invention.

Referring to FIG. 9(A), the body of a mobile computer is indicated by 2001. This body 2001 has a display device comprising a reflective LCD panel 2005. A camera portion 2002 having both an image pickup portion 2003 and an operation switch 2004 is attached to the body 2001.

Figure 9B:
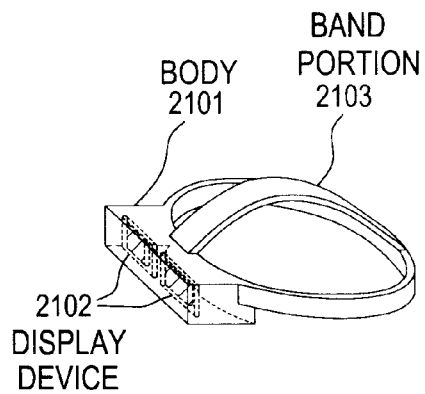

Referring to FIG. 9(B), the body of a head mount display is indicated by 2101 and has reflective LCD panels 2102. A band portion 2103 is attached to the body 2101.

Figure 9C:
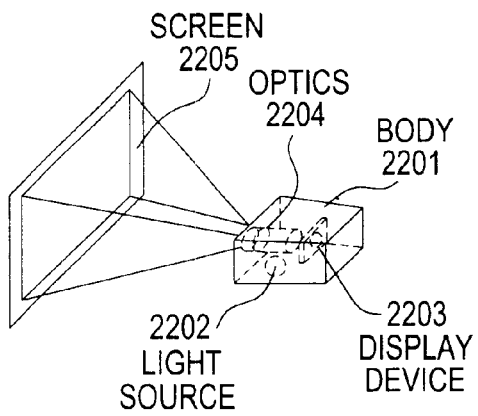

Referring to FIG. 9(C), there is shown a front projection system comprising a display body 2201 and a screen 2205 located in front of it. This body 2201 has a light source 2202, a reflective LCD panel 2203, and optics 2204. Light from the light source 2202 is directed to the reflective LCD panel 2203 via the optics 2204. Then, the LCD panel 2203 optically modulates the image. The image is projected onto the screen 2205 after magnified by the optics 2204. This type of projection system needs the screen 2205 separate from the body 2201.

Figure 9D:
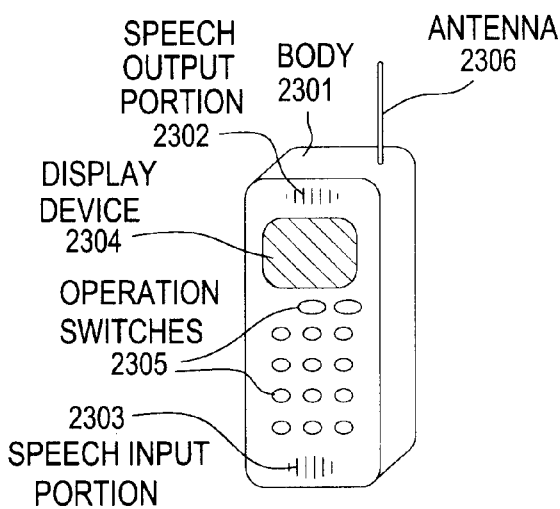

Referring next to FIG. 9(D), there is shown a mobile telephone whose body is indicated by 2301. The body 2301 has a speech output portion 2302, a speech input portion 2303, a reflective LCD panel 2304, and operation switches 2305. An antenna 2306 is attached to the body 2301.

Figure 9E:
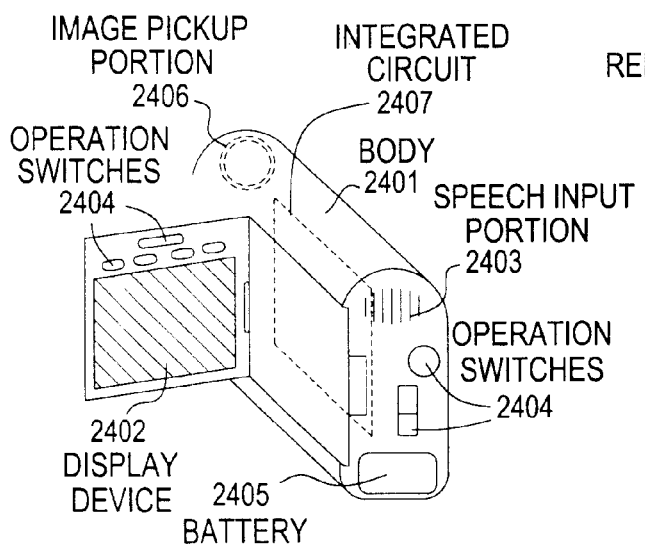

Referring to FIG. 9(E), there is shown a video camera whose body is indicated by 2401. This body 2401 has a reflective LCD 2402, a speech input portion 2403, operation switches 2404, batteries 2405, and an image pickup portion 2406.

Figure 9F:
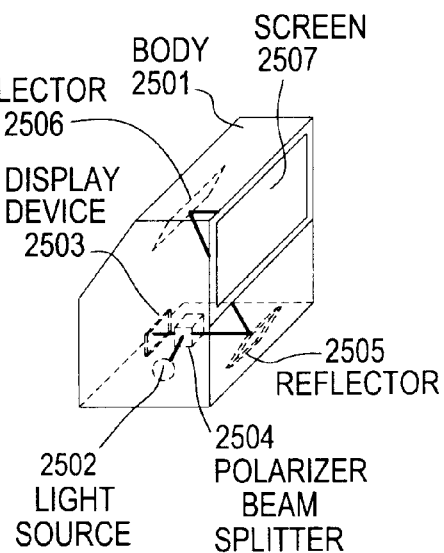

Referring to FIG. 9(F), there is shown a rear projection system whose body is indicated by 2501. The body 2501 has a light source 2502, a reflective LCD panel 2503, a polarizing beam splitter 2504, and reflectors 2505, 2506. A screen 2507 is positioned on the body 2501. Light emitted by the light source 2502 is optically modulated by the LCD panel 2503 via the polarizing beam splitter 2504 and directed at the reflectors 2505 and 2506. Then, the light is reflected by these reflectors and projected onto the screen 2507 on the body 2501.

Figure 10:
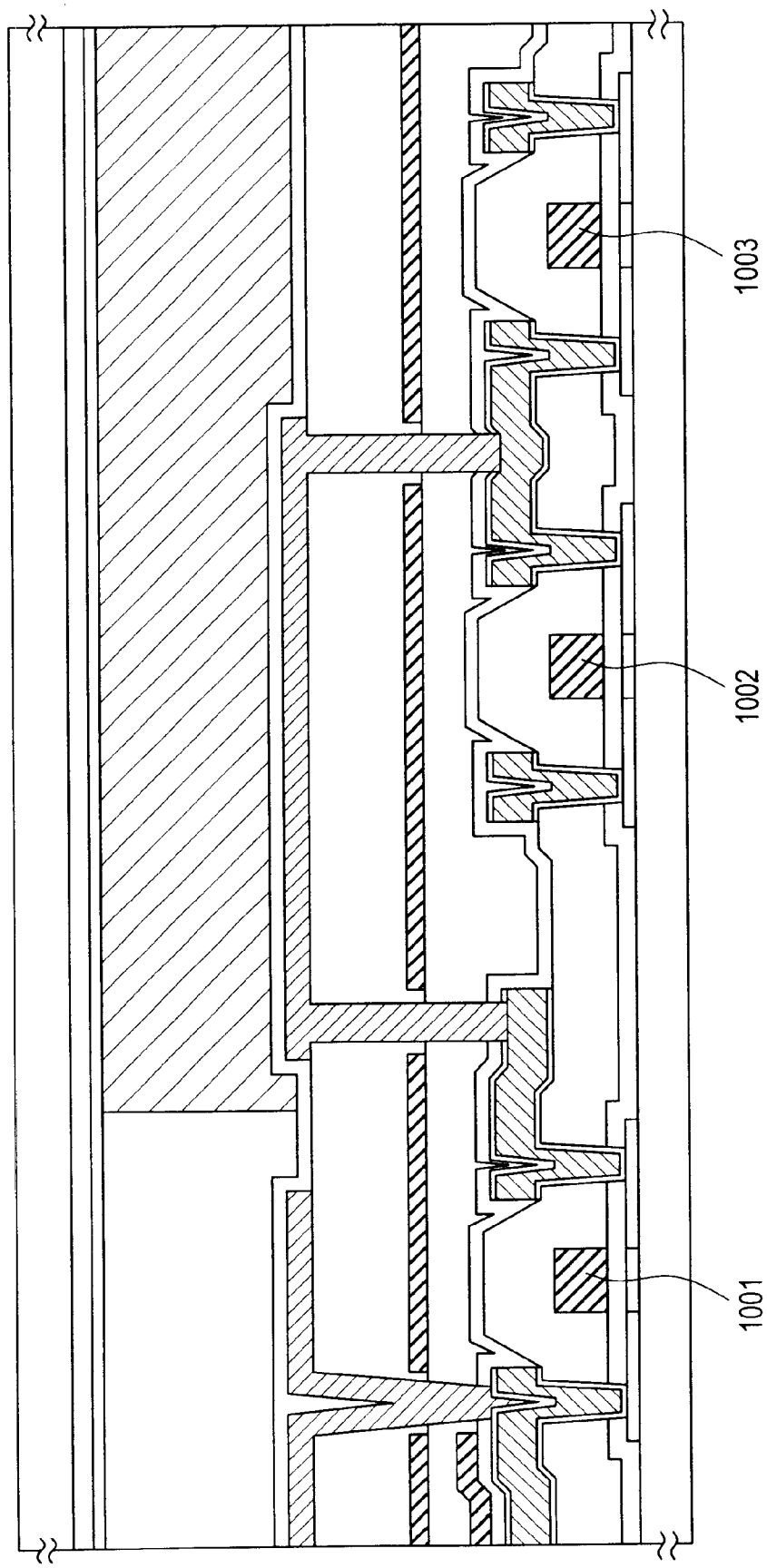
FIG. 10 is a cross-sectional view of another LCD panel in accordance with the invention.

A third embodiment of the present invention is based on the first-mentioned embodiment shown in FIGS. 1–7 and further characterized in that gate electrodes consist mainly of silicon. The present embodiment is schematically shown in FIG. 10, where gate electrodes 1001, 1002, and 1003 are made of silicon to which one conductivity type is imparted. The gate electrodes may also be made of other materials such as various silicides and metal materials.

The invention disclosed herein makes it possible to achieve multilevel metallization with greater ease than conventional, the multilevel metallization being required in peripheral driver circuits of a device where an active matrix circuit is integrated with the peripheral driver circuits.

What is claimed is:

1. A display panel comprising:
   a first TFT provided in an active matrix circuit over a substrate and comprising a first source region and a first drain region;
   a second TFT provided in a driver circuit over said substrate and comprising a second source region and a second drain region;
   a first interlayer insulating film provided over said first source region and said first drain region and said second source region and said second drain region;
   a first electrode provided over said first interlayer insulating film and connected with one of said first source region and said first drain region;

a second electrode provided over said first interlayer insulating film and connected with one of said second source region and said second drain region;

a second interlayer insulating film provided over said first electrode and said second electrode;

reflective pixel electrodes provided over said second interlayer insulating film and arranged in rows and columns in said active matrix circuit and made of a material; and conducting lines provided over said second interlayer insulating film and contained in said driver circuit and made of the same material as said reflective pixel electrodes.

2. A panel according to claim 1 wherein said reflective pixel electrodes comprise a metal.

3. A display panel comprising:

a first TFT provided in an active matrix circuit over a substrate and comprising a first source region and a first drain region;

a second TFT provided in a driver circuit over said substrate and comprising a second source region and a second drain region;

a first interlayer insulating film provided over said first source region and said first drain region and said second source region and said second drain region;

a first electrode provided over said first interlayer insulating film and connected with one of said first source region and said first drain region;

a second electrode provided over said first interlayer insulating film and connected with one of said second source region and said second drain region;

a second interlayer insulating film provided over said first electrode and said second electrode;

reflective pixel electrodes provided over said second interlayer insulating film and arranged in rows and columns in said active matrix circuit; and conducting lines provided over said second interlayer insulating film and contained in said driver circuit, said conducting lines and said reflective pixel electrodes being fabricated by a same process step.

4. A panel according to claim 3 wherein said reflective pixel electrodes comprise a metal.

5. A device equipped with a display panel, said display panel comprising:

a first TFT provided in an active matrix circuit over a substrate and comprising a first source region and a first drain region;

a second TFT provided in a driver circuit over said substrate and comprising a second source region and a second drain region;

a first interlayer insulating film provided over said first source region and said first drain region and said second source region and said second drain region;

a first electrode provided over said first interlayer insulating film and connected with one of said first source region and said first drain region;

a second electrode provided over said first interlayer insulating film and connected with one of said second source region and said second drain region;

a second interlayer insulating film provided over said first electrode and said second electrode;

reflective pixel electrodes provided over said second interlayer insulating film and arranged in rows and columns in said active matrix circuit and made of a material; and conducting lines provided over said second interlayer insulating film and contained in said driver circuit and made of the same material as said reflective pixel electrodes.

6. A device according to claim 5 wherein said reflective pixel electrodes comprise a metal.

7. A device according to claim 5 wherein said device is selected from the group consisting of video camera, digital still camera, head mount display, car navigational system, personal computer, portable intelligent terminal, mobile computer, portable telephone, front projection system and rear projection system.

8. A device equipped with a display panel, said display panel comprising:

a first TFT provided in an active matrix circuit over a substrate and comprising a first source region and a first drain region;

a second TFT provided in a driver circuit over said substrate and comprising a second source region and a second drain region;

a first interlayer insulating film provided over said first source region and said first drain region and said second source region and said second drain reg ion;

a first electrode provided over said first interlayer insulating film and connected with one of said first source region and said first drain region;

a second electrode provided over said first interlayer insulating film and connected with one of said second source region and said second drain region;

a second interlayer insulating film provided over said first electrode and said second electrode;

reflective pixel electrodes provided over said second interlayer insulating film and arranged in rows and columns in said active matrix circuit; and conducting lines provided over said second interlayer insulating film and contained in said driver circuit, said conducting lines and said reflective pixel electrodes being fabricated by a same process step.

9. A device according to claim 8 wherein said reflective pixel electrodes comprise a metal.

10. A device according to claim 8 wherein said device is selected from the group consisting of video camera, digital still camera, head mount display, car navigational system, personal computer, portable intelligent terminal, mobile computer, portable telephone, front projection system and rear projection system.

11. A display device comprising:

a first TFT provided in an active matrix circuit over a substrate and comprising a first source region and a first drain region;

a second TFT provided in a driver circuit over said substrate and comprising a second source region and a second drain region;

a first interlayer insulating film provided over said first source region and said first drain region and said second source region and said second drain region;

a first electrode provided over said first interlayer insulating film and connected with one of said first source region and said first drain region;

a second electrode provided over said first interlayer insulating film and connected with one of said second source region and said second drain region;

a third electrode provided over said first interlayer insulating film and connected with the other of said first source region and said first drain region;

a second interlayer insulating film provided over said first electrode and said second electrode and said third electrode;

a reflective pixel electrode provided over said second interlayer insulating film and connected with said first electrode and made of a material; and a conducting line made of the same material as said reflective pixel electrode and provided over said second interlayer insulating film and connected with said third electrode and connected with said second electrode.

12. A device according to claim 11 wherein said reflective pixel electrode comprises a metal.

13. A device according to claim 11 wherein said display device is incorporated into a device selected from the group consisting of video camera, digital still camera, head mount display, car navigational system, personal computer, portable intelligent terminal, mobile computer, portable telephone, front projection system and rear projection system.

14. A display device comprising:

a first TFT provided in an active matrix circuit over a substrate and comprising a first source region and a first drain region;

a second TFT provided in a driver circuit over said substrate and comprising a second source region and a second drain region;

a third TFT provided in said driver circuit over said substrate and comprising a third source region and a third drain region;

a first interlayer insulating film provided over said first source region and said first drain region and said second source region and said second drain region and said third source region and said third drain region;

a first electrode provided over said first interlayer insulating film and connected with one of said first source region and said first drain region;

a second electrode provided over said first interlayer insulating film and connected with one of said second source region and said second drain region and connected with one of said third source region and said third drain region;

a third electrode provided over said first interlayer insulating film and connected with the other of said first source region and said first drain region;

a second interlayer insulating film provided over said first electrode and said second electrode and said third electrode;

a reflective pixel electrode provided over said second interlayer insulating film and connected with said first electrode and made of a material; and a conducting line made of the same material as said reflective pixel electrode and connected with said third electrode and connected with said second electrode, said conducting line being provided over said second interlayer insulating film.

15. A device according to claim 14 wherein said reflective pixel electrode comprises a metal.

16. A device according to claim 14 wherein said resin comprises a material selected from the group consisting of polyimide, polyamide, polyimidamide, epoxy and acrylic.

17. A device according to claim 14 wherein said display device is incorporated into a device selected from the group consisting of video camera, digital still camera, head mount display, car navigational system, personal computer, portable intelligent terminal, mobile computer, portable telephone, front projection system and rear projection system.

18. A display device comprising:

a first TFT provided in an active matrix circuit over a substrate and comprising a first source region and a first drain region;

a second TFT provided in a driver circuit over said substrate and comprising a second source region and a second drain region;

a third TFT provided in said driver circuit over said substrate and comprising a third source region and a third drain region;

a first interlayer insulating film provided over said first source region and said first drain region and said second source region and said second drain region and said third source region and said third drain region;

a first electrode provided over said first interlayer insulating film and connected with one of said first source region and said first drain region;

a second electrode provided over said first interlayer insulating film and connected with one of said second source region and said second drain region and connected with one of said third source region and said third drain region;

a third electrode provided over said first interlayer insulating film and connected with the other of said first source region and said first drain region;

a second interlayer insulating film provided over said first electrode and said second electrode and said third electrode;

a reflective pixel electrode provided over said second interlayer insulating film in said active matrix circuit and made of a material; and a conducting line provided over said second interlayer insulating film in said driver circuit and made of the same material as said reflective pixel electrode.

19. A device according to claim 18 wherein said reflective pixel electrode comprises a metal.

20. A device according to claim 18 wherein said resin comprises a material selected from the group consisting of polyimide, polyamide, polyimidamide, epoxy and acrylic.

21. A device according to claim 18 wherein said display device is incorporated into a device selected from the group consisting of video camera, digital still camera, head mount display, car navigational system, personal computer, portable intelligent terminal, mobile computer, portable telephone, front projection system and rear projection system.

* * * * *